US007768253B2

(12) United States Patent
Kidd

(10) Patent No.: US 7,768,253 B2
(45) Date of Patent: Aug. 3, 2010

(54) SAMPLING MODULE AND A METHOD OF SAMPLING ONE OR MORE ANALOGUE CHARACTERISTICS OF A POWER TRANSMISSION SYSTEM

(75) Inventor: Simon Kidd, Hixon (GB)

(73) Assignee: Areva T&D UK Limited, Stafford (GB)

( * ) Notice: Subject to any disclaimer, the term of this patent is extended or adjusted under 35 U.S.C. 154(b) by 180 days.

(21) Appl. No.: 12/090,873

(22) PCT Filed: Oct. 19, 2006

(86) PCT No.: PCT/EP2006/067594

§ 371 (c)(1),
(2), (4) Date: Apr. 21, 2008

(87) PCT Pub. No.: WO2007/045682

PCT Pub. Date: Apr. 26, 2007

(65) Prior Publication Data

US 2009/0315537 A1    Dec. 24, 2009

(30) Foreign Application Priority Data

Oct. 21, 2005  (GB) .................................. 0521411.9

(51) Int. Cl.
*G01R 19/18* (2006.01)
*H04L 7/00* (2006.01)
*H03M 3/00* (2006.01)

(52) U.S. Cl. ..................... 324/118; 324/158.1; 375/355; 341/122

(58) Field of Classification Search ................. 324/118, 324/126, 140 R, 158.1; 375/355; 341/122–172
See application file for complete search history.

(56) References Cited

U.S. PATENT DOCUMENTS

| 6,996,200 | B2 * | 2/2006 | Schubert et al. ............. 375/355 |
| 7,209,061 | B2 * | 4/2007 | Somayajula ................ 341/122 |
| 2004/0133370 | A1 * | 7/2004 | Lavoie et al. ................. 702/60 |

FOREIGN PATENT DOCUMENTS

| GB | 2 321 713 | 8/1998 |
| JP | 55 110428 | 8/1980 |

OTHER PUBLICATIONS

Van Wyk, W. F., "Implementation of a Modern Microprocessor Based Voltage Quality Recorder", IEEE, vol. 2, pp. 1024-1028 (1996).

* cited by examiner

*Primary Examiner*—Ha Tran T Nguyen
*Assistant Examiner*—Emily Y Chan
(74) *Attorney, Agent, or Firm*—Oblon, Spivak, McClelland, Maier & Neustadt, L.L.P.

(57) ABSTRACT

A sampling module, for sampling one or more analog characteristics of a power transmission system, including at least one input circuit for sampling a respective analog characteristic. Each input circuit includes: a scaling circuit for reducing the magnitude of the analog characteristic to a desired level; an isolating circuit for creating an electrical barrier between respective upstream and downstream portions of the input circuit; and an analog to digital converter for digitizing the analog characteristic to produce a digital data stream. The scaling circuit is electrically connected to an input of the analog to digital converter, and the isolating circuit is electrically connected directly to an output thereof.

10 Claims, 3 Drawing Sheets

SAMPLING MODULE AND A METHOD OF SAMPLING ONE OR MORE ANALOGUE CHARACTERISTICS OF A POWER TRANSMISSION SYSTEM

BACKGROUND OF THE INVENTION

1. Field of the Invention

This invention relates to in particular, but not exclusively, a sampling module and a method of sampling one or more analogue characteristic of a power transmission system.

2. Description of the Related Art

An intelligent Electronic Device (IED) uses samples of the analogue voltage and current characteristics of a power transmission system to help protect and control the system.

A conventional arrangement for sampling such analogue characteristics is a, so called, "multiplex system", as shown schematically in FIG. 1.

A typical multiplex system 10 includes a plurality of inputs 12, each for sampling a respective analogue characteristic.

Each input 12 includes an isolating transformer 14 and an anti-aliasing filter 16 electrically connected in series therewith.

An output of each anti-aliasing filter 16 is connected to an analogue multiplexer 18 which is, in turn, connected in series with a hold filter 20.

The hold filter 20 is connected in series with an analogue to digital converter (ADC) 22.

In use, each isolation transformer 14 steps down, i.e. reduces, the magnitude of the sampled analogue characteristic to a level suitable for analogue to digital conversion by the ADC. In addition, each isolating transformer 14 isolates the remaining portion of the multiplex system 10.

Isolation is required because each input 12 is connected via a step down transformer (not shown) to the power transmission system operating at a higher voltage.

The isolating transformer provides protection against voltages induced in the wiring and differences in earth potential that may exist between the location of the step down transformer and the location of the IED. The isolation provided also protects a human operator and the various other components of the system from the high voltages at the inputs 12.

The analogue characteristic is fed from each isolating transformer 14 through a corresponding anti-aliasing filter 16 to remove noise and high frequency harmonics.

The analogue multiplexer 18 then feeds each filtered analogue characteristic sequentially to the hold filter 20 which stabilises the respective analogue characteristic. This allows the ADC 22 to digitise each characteristic before outputting a digital data stream to a processing module 24.

There are a number of disadvantages associated with the aforementioned multiplex system 10.

Each of the isolating transformers 14 needs to be physically large in order to accurately reproduce the analogue characteristic. As a consequence the system 10 is large and heavy.

In addition, each of the isolating transformers 14 has a limited linear operating range. This results in non-linearity errors which are often at their most severe when the greatest accuracy is needed.

Furthermore, each isolating transformer 14 tends to leak flux. Consequently, close packing of the isolating transformers 14 leads to cross-talk between adjacent transformers 14.

Therefore it is a general aim of the invention to provide a sampling module which is more compact and more accurate than conventional multiplex sampling systems.

SUMMARY OF THE INVENTION

According to a first aspect of the invention there is provided a sampling module, for sampling one or more analogue characteristics of a power transmission system, comprising at least one input circuit for sampling a respective analogue characteristic, the or each input circuit including:

a scaling circuit for reducing the magnitude of the analogue characteristic to a desired level;

an isolating circuit for creating an electrical barrier between respective upstream and downstream portions of the input circuit; and an analogue to digital converter for digitising the analogue characteristic to produce a digital data stream, the scaling circuit, the isolating circuit and the analogue to digital converter being electrically connected in series.

The inclusion of separate scaling and isolating circuits allows for optimisation of the scaling and isolating functions while obviating the need for conventional isolating transformers.

This results in a sampling module which is more compact and lighter than a conventional multiplex system. The invention is also able to provide more accurate sampling because it permits the reduction of cross talk and non-linearity errors.

In addition, the inclusion of an analogue to digital converter (ADC) in each input circuit allows for the concurrent sampling of a plurality of analogue characteristics, thereby eliminating the bottleneck associated with the analogue multiplexer 18 of conventional multiplex systems 10.

Furthermore, concurrent sampling obviates the skew introduced in conventional multiplex systems 10 when samples can only be taken consecutively.

Concurrent sampling also makes it possible to configure differing sample rates for respective analogue characteristics according to the degree of resolution required.

Preferably the scaling circuit is electrically connected to an input of the analogue to digital converter and the isolating circuit is electrically connected to an output thereof.

Isolating the digital data stream in this way reduces the likelihood of any external noise corrupting the data stream.

In addition, isolating the digital data stream also means that it is not necessary to faithfully reproduce the digital data when transferring it across the electrical barrier. This is because it is only necessary downstream of the electrical barrier to be able to discern a 0 or a 1 rather than, e.g. a complete analogue waveform.

Conveniently the scaling circuit is or includes a resistor network. This results in the scaling circuit having a linear response over a desired measurement range, thereby helping to minimise non-linearity errors.

Optionally the resistor network defines a potential divider.

Alternatively the resistor network defines a shunt.

The foregoing arrangements allow the sampling of analogue voltage and analogue current characteristics, respectively.

In a preferred embodiment of the invention the analogue to digital converter is or includes a sigma-delta modulator. The inclusion of a sigma-delta modulator allows for the transfer of a single-bit word, i.e. a 0 or a 1, across the electrical barrier of the isolating circuit at a high frequency.

This results in the digitised analogue characteristic having a finer resolution compared to that produced by a conventional 16-bit ADC, Preferably the isolating circuit is or includes a single pulse transformer. Such a transformer has particularly desirable transfer characteristics while providing a desired degree of electrical isolation downstream thereof.

Optionally the sampling module further includes a data interface electrically connected to the or each input circuit so as to allow the output of a respective digital data stream to a processing module.

Conveniently the downstream portion of the or each input circuit includes a digital signal processing module.

In another preferred embodiment of the invention the digital signal processing module includes a digital filter.

In a further preferred embodiment of the invention the digital signal processing module includes a re-sampling module.

In a still further preferred embodiment of the invention the sampling module further includes a control interface electrically connected to the or each input circuit so as to permit configuration of the digital signal processing module and the ADC by a control module.

The foregoing features permit processing of the digitised analogue characteristic to a desired degree before output to a processing module.

According to a second aspect of the invention there is provided a method of sampling one or more analogue characteristics of a power transmission system, comprising the steps of providing at least one input circuit for sampling a respective analogue characteristic, and electrically connecting in series within the or each input circuit:

a scaling circuit for reducing the magnitude of the analogue characteristic to a desired level;

an isolating circuit for creating an electrical barrier between respective upstream and downstream portions of the input circuit; and an analogue to digital converter for digitising the analogue characteristic to produce a digital data stream.

The method of the invention shares the advantages associated with the aforementioned sampling module according to the invention.

BRIEF DESCRIPTION OF THE DRAWINGS

There now follows a brief description of a preferred embodiment of the invention, by way of non-limiting example, with reference being made to the accompanying drawings in which.

DETAILED DESCRIPTION OF THE INVENTION

Figure 1:
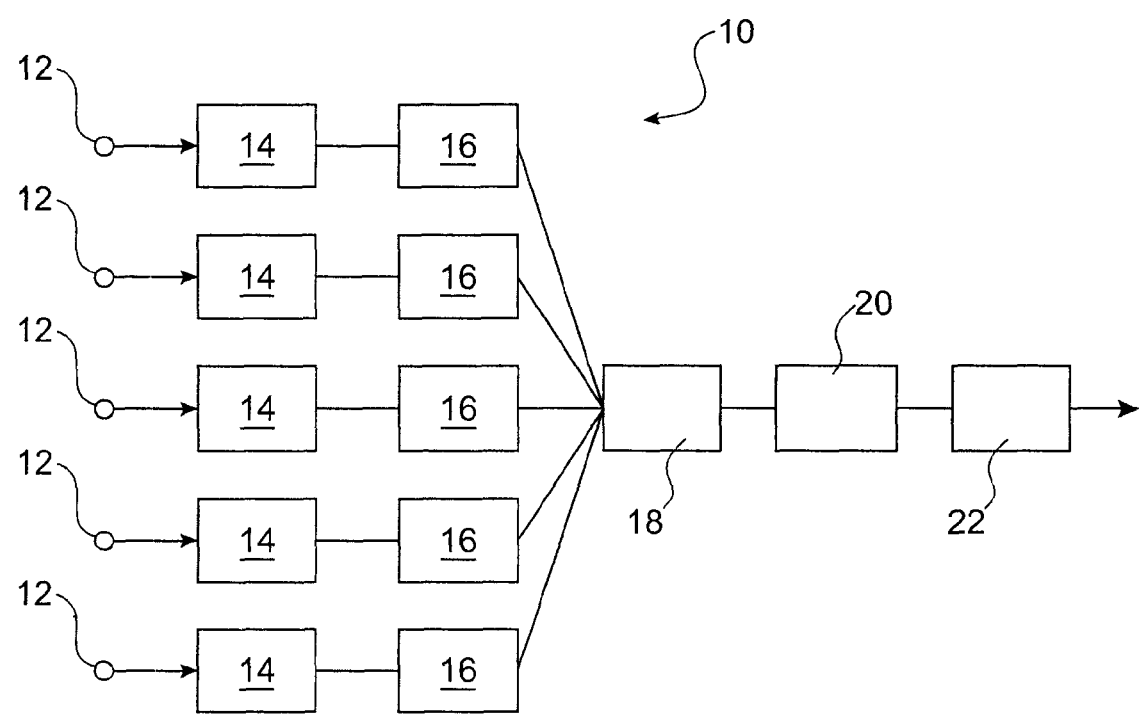
FIG. 1 is a schematic of a known multiplex sampling system.

A sampling module according to a first embodiment of the invention is designated generally by the reference numeral 30.

The sampling module 30 includes a plurality of input circuits 32, each input circuit 32 being for sampling a particular analogue characteristic of a power transmission system (not shown) to which the sampling module 30 is electrically connected.

In the embodiment shown each input circuit 32 includes a scaling circuit 34 at an upstream, input end 36 thereof. The scaling circuit 34 is electrically connected in series to an input of an analogue to digital converter (ADC) 22. A preferred ADC 22, in the form of a sigma-delta modulator 38, is shown.

An output of the sigma-delta modulator 38 is electrically connected in series to an isolating circuit 40.

In other embodiments of the invention differing series arrangements of the scaling circuit 34, ADC 22, and isolating circuit 40 are also possible.

In each input circuit 32 the scaling circuit 34 is a resistor network (not shown). The resistor network may be in the form of a potential divider or a shunt, for sampling analogue voltage and analogue current characteristics, respectively.

Figure 4:
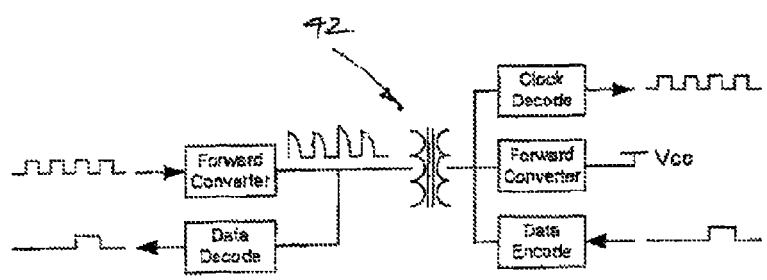
FIG. 4 is a schematic of a preferred isolating circuit according to the invention.

Each isolating circuit 40 includes a single pulse transformer 42, as detailed schematically in FIG. 4.

A portion of each input circuit 32 downstream from the isolating circuit 40 includes a digital signal processing module 44, each of which includes digital filter 46 and a re-sampling module 48.

The output of each digital signal processing module 44 is electrically connected to a data interface which, in turn, is connectable to a processing module 24.

The sampling module 30 also includes a control interface 52 which is electrically connected to each input circuit 32. The control interface 52 is configured to be connectable to a control module (not shown), which permits configuration of the digital signal processing module 44 and the ADC 22.

Figure 3:
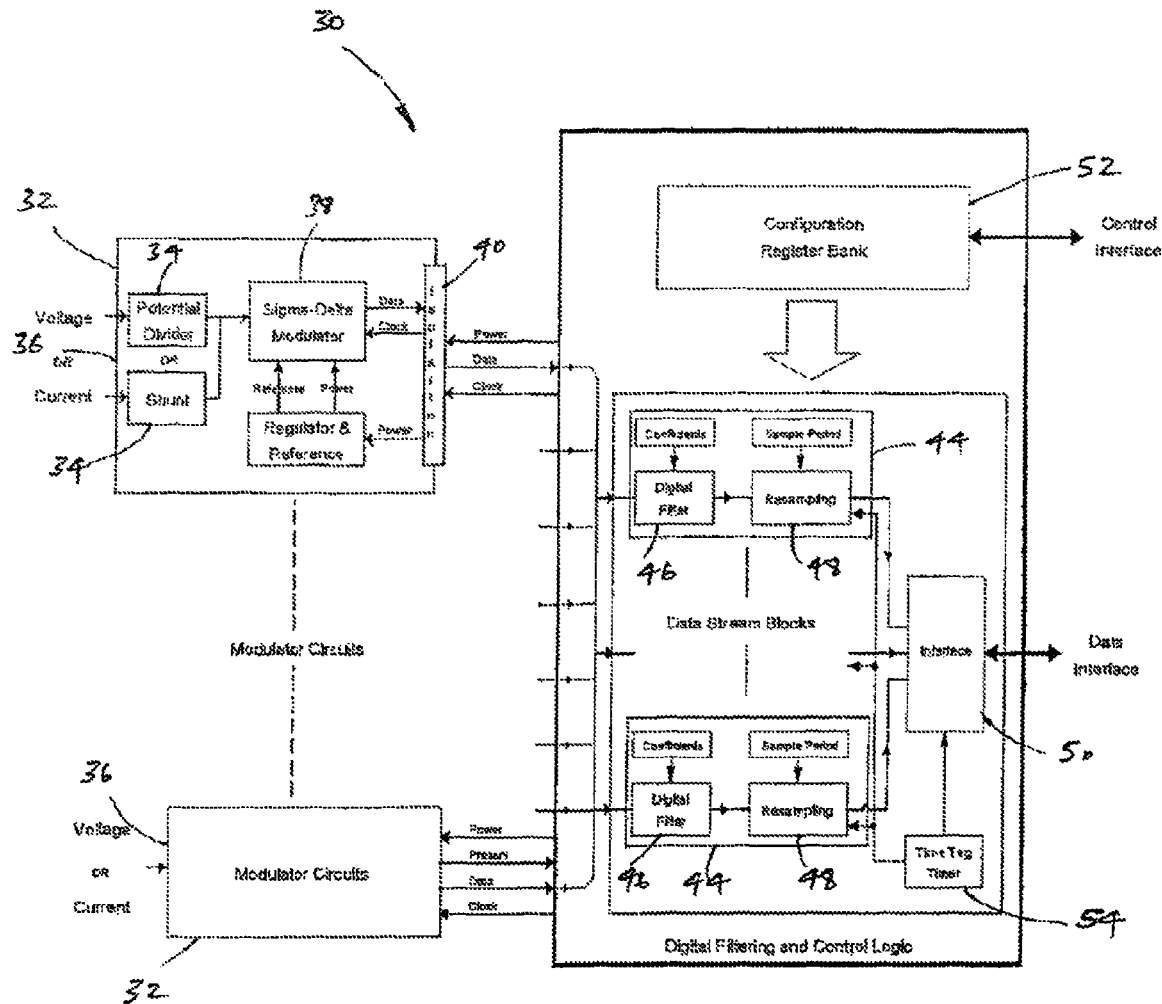
FIG. 3 is a more detailed schematic of the sampling module shown in FIG. 2.

In addition, the embodiment of the sampling module 30 shown also includes a master clock 54 (FIG. 3).

In use, each scaling circuit 34 scales a respective sampled analogue characteristic to a level suitable for analogue to digital conversion by the corresponding sigma-delta modulator 38. It is possible to determine the measurement range of each scaling circuit 34 by selecting the values of the resistors therein.

Furthermore, it is possible to improve the accuracy of each sampled analogue characteristic by calibrating each scaling circuit 34. Calibration could correct any linear gain or offset errors introduced by a given scaling circuit 34. Calibration could also correct any inversion of the sampled analogue characteristic caused by incorrect assembly of the scaling circuit 34.

Each sigma-delta modulator 38 outputs a 1-bit, serial, digital data stream corresponding to a given sampled analogue characteristic. A clock signal controls the sampling rate of each sigma-delta modulator 38.

Respective single pulse transformers 42 transfer the digital data stream in a first direction from the sigma-delta modulator 38 to a digital signal processor 44, while creating an electrical barrier between these respective components. Each digital signal processor 44 may be configured to receive one or more digital data streams.

Each single pulse transformer 42 also transfers power to drive the corresponding sigma-delta modulator 38, and the aforementioned clock signal, in a second, opposite direction.

Each single pulse transformer 42 implements a forward converter topology with a frequency of operation equal to that of the clock signal, thereby allowing the corresponding sigma-delta modulator 38 to derive the clock signal directly from the transferred power.

Transfer of the binary signal data stream is achieved by changing the amplitude of the voltage used to reset the transformer's flux, on a cycle by cycle basis, from the secondary side of the forward converter. Monitoring of the converter's primary waveform determines whether a high voltage has been used to quickly reset the flux or a low voltage has been used to reset the flux more slowly.

The digital filter 46 of each digital signal processing module 44 filters a respective digital data stream to, e.g. remove any extraneous noise.

The re-sampling module 48 of each digital signal processing module 44 is able to generate a digital data stream having a desired sampling rate.

Configuration of the digital signal processing module 44 and the sampling rate of each sigma-delta modulator 38 is conducted through the control interface 52, thereby allowing for differing sample rates and filtering characteristics in each input circuit 32 according to the requirements of an attached processing module 24, connected via the data interface 50.

Each input circuit 32 transmits its digital data stream corresponding to a given sampled analogue characteristic, to the processing module 24 via the data interface 50. The master clock 54 time tags each digital data stream so as to ensure that the data within a particular stream is correctly synchronised following transmission to the external device.

Accordingly, each input circuit 32 contributes an independently filtered sample value to a given digital data stream.

Figure 2:
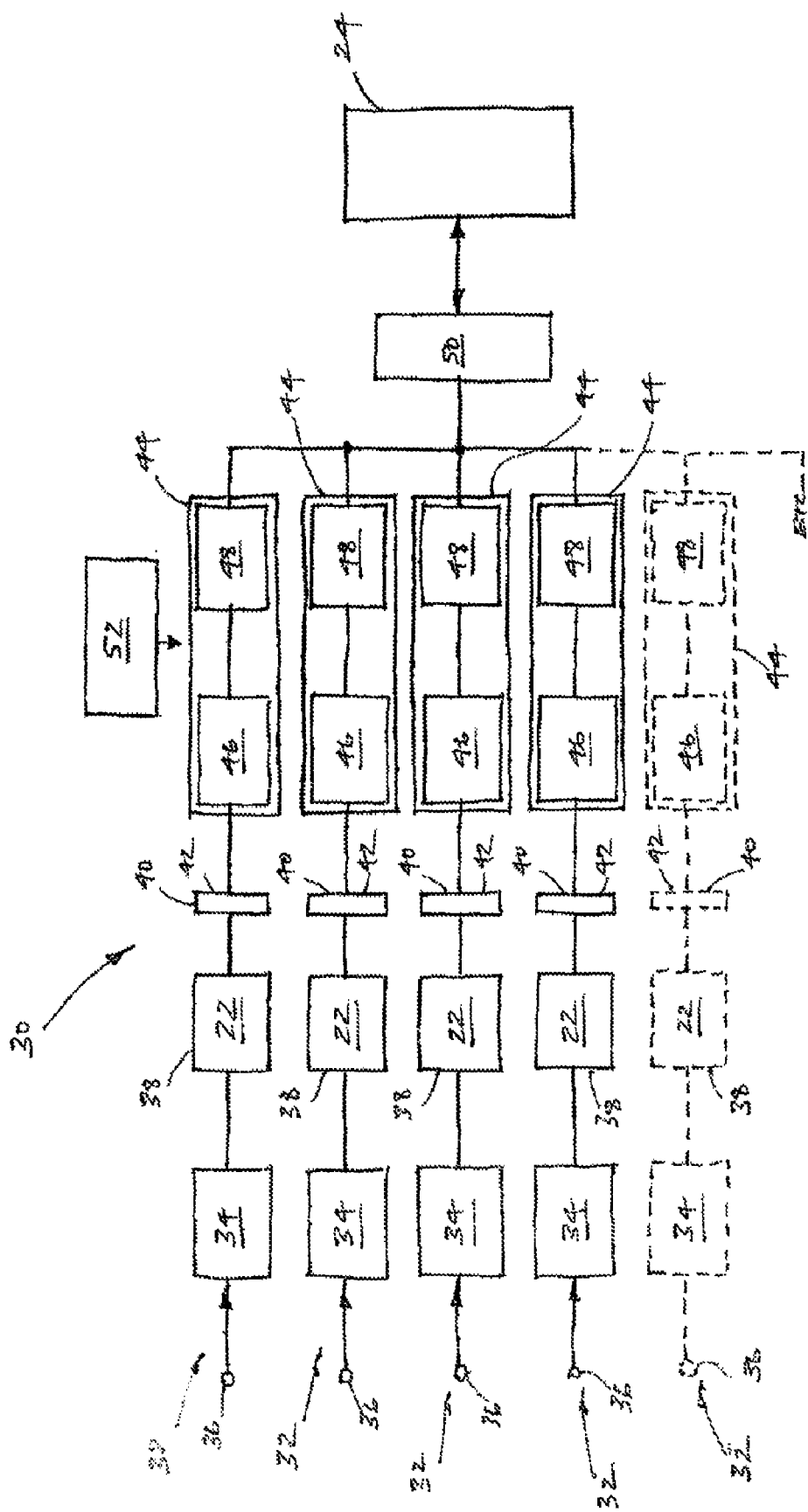
FIG. 2 is a schematic of a sampling module according to a first embodiment of the invention.

Each data stream block (44 in FIG. 3) accepts the isolated bit streams from every input circuit (32 in FIG. 3), filters them to remove unwanted frequency components and then resamples them to produce packets of samples at the sample rate required by the IED (24 in FIG. 2). The parameters of the digital filter (46 in FIG. 3) and the period of the resampling logic (48 in FIG. 3) can both be configured by the IED (24), on-the-fly if necessary, to suit the particular protection algorithm. As the invention contains multiple concurrent data stream blocks (44), it is possible to have different protection algorithms running simultaneously within the IED that require sample data at different rates and with different levels of filtering.

The invention claimed is:

1. An intelligent electronic device comprising:
    a sampling module that samples one or more analog characteristics of a power transmission system, the sampling module comprising at least one input circuit for sampling a respective analog characteristic, the input circuit comprising:
        a scaling circuit that reduces magnitude of the analog characteristic to a desired level;
        an isolating circuit that creates an electrical barrier between respective upstream and downstream portions of the input circuit;
        an analog to digital converter that digitizes the analog characteristic to produce a 1-bit serial digital data stream,
        the scaling circuit being electrically connected to an input of the analog to digital converter, and the isolating circuit being electrically connected directly to an output thereof;
    wherein the sampling module further comprises a digital signal processing module in series with the isolating circuit and comprising a digital filter that digitally filters the 1-bit serial digital data stream and a resampling module that re-samples the filtered data stream output from the digital filter, and
    wherein the intelligent electronic device further comprises an additional processing module in series with the digital signal processing module, the digital signal processing module producing packets of samples at a sample rate required by the additional processing module, parameters of the digital filter and a period of the resampling module being both configured by the additional processing module to suit a particular algorithm.

2. An intelligent electronic device according to claim 1, wherein the sampling module comprises a plurality of parallel input circuits and a plurality of parallel digital signal processing modules, an output of each input circuit being connected to an input of each digital signal processing module, parameters of digital filtering of the digital filters of the digital signal processing modules and a period of resampling of the resampling modules of the digital signal processing modules being configured by the additional processing module to suit different protection algorithms running simultaneously within the additional processing module that require data at different rates and with different levels of filtering.

3. An intelligent electronic device according to claim 1, wherein the scaling circuit is or includes a resistor network.

4. Intelligent electronic device according to claim 3, wherein the resistor network defines a potential divider.

5. Intelligent electronic device according to claim 3, wherein the resistor network defines a shunt.

6. Intelligent electronic device according to claim 1, wherein the analog to digital converter is or includes a sigma-delta modulator.

7. Intelligent electronic device according to claim 1, wherein the analog to digital converter is controlled with a clock signal and the isolating circuit is or includes a single pulse transformer that transfers a) the 1-bit digital data stream in a first direction from the analog to digital converter to the digital signal processing module and b) power to drive the corresponding analog to digital converter and the clock signal in a second opposite direction, the single pulse transformer implementing a forward converter topology with a frequency of operation equal to that of the clock signal, thereby allowing the corresponding analog to digital converter to derive the clock signal directly from the transferred power.

8. A processing method comprising:
    sampling one or more analog characteristics of a power transmission system comprising at least one input circuit, the sampling comprising at least one inputting comprising:
        reducing magnitude of the analog characteristic to a desired level;
        creating an electrical barrier between respective upstream and downstream portions of the input circuit;
        digitizing the analog characteristic to produce a 1-bit digital data stream;
    wherein said sampling further comprises a digital signal processing following the at least one inputting and comprising digital filtering the 1-bit digital data stream followed by resampling the filtered data stream output from the digital filtering, and
    wherein the processing method further comprises an additional processing, the digital signal processing producing packets of samples at a sample rate required by the additional processing, parameters of the digital filtering and period of the resampling being both configured by the additional processing to suit a particular algorithm.

9. A processing method according to claim 8, wherein the sampling method further comprises a plurality of parallel inputtings and a plurality of parallel digital signal processings, data output by each inputting being processed by each digital signal processing, parameters of digital filtering and a period of resampling of the parallel digital signal processing being configured by the additional processing to suit different protection algorithms running simultaneously within the additional processing that require data at different rates and with different levels of filtering.

10. A processing method according to claim 8, wherein the digitizing is controlled with a clock signal and the creating an electrical barrier transfers a) the 1-bit digital data stream in a first direction from an analog to digital converter that implements the digitizing to a digital signal processing module that implements the digital signal processing and b) power to drive the corresponding analog to digital converter and the clock signal in a second opposite direction, a single pulse transformer implementing a forward converter topology with a frequency of operation equal to that of the clock signal, thereby allowing the corresponding analog to digital converter to derive the clock signal directly from the transferred power.

* * * * *